United States Patent
Gu et al.

(10) Patent No.: US 8,847,110 B2
(45) Date of Patent: Sep. 30, 2014

(54) LASER PROCESSING OF CONDUCTIVE LINKS

(75) Inventors: Bo Gu, North Andover, MA (US); Joseph J. Griffiths, Winthrop, MA (US); Joohan Lee, Andover, MA (US)

(73) Assignee: Electro Scientific Industries, Inc., Portland, OR (US)

( * ) Notice: Subject to any disclaimer, the term of this patent is extended or adjusted under 35 U.S.C. 154(b) by 46 days.

(21) Appl. No.: 13/359,879

(22) Filed: Jan. 27, 2012

(65) Prior Publication Data

US 2012/0195331 A1     Aug. 2, 2012

Related U.S. Application Data

(63) Continuation of application No. 12/121,684, filed on May 15, 2008, now Pat. No. 8,106,329.

(60) Provisional application No. 60/938,967, filed on May 18, 2007.

(51) Int. Cl.
| | |
|---|---|
| B23K 26/06 | (2014.01) |
| B23K 26/36 | (2014.01) |
| B23K 26/073 | (2006.01) |
| B23K 26/40 | (2014.01) |
| H01L 23/525 | (2006.01) |

(52) U.S. Cl.
CPC ............ *B23K 26/073* (2013.01); *B23K 26/36* (2013.01); *B23K 26/06* (2013.01); *B23K 26/0635* (2013.01); *B23K 26/4005* (2013.01); *B23K 26/401* (2013.01); *B23K 2201/40* (2013.01); *B23K 2203/12* (2013.01); *H01L 23/5258* (2013.01)
USPC ................................ 219/121.68; 219/121.61

(58) Field of Classification Search
CPC ............................... B23K 26/06; B23K 26/36
USPC ........................ 219/121.61, 121.68, 121.69
See application file for complete search history.

(56) References Cited

U.S. PATENT DOCUMENTS

| | | | |
|---|---|---|---|
| 3,902,130 A | 8/1975 | Pike | |
| 5,909,306 A * | 6/1999 | Goldberg et al. | 359/337.1 |
| 6,148,011 A | 11/2000 | Larose et al. | |
| 6,275,250 B1 | 8/2001 | Sanders et al. | |
| 6,340,806 B1 | 1/2002 | Smart et al. | |
| 6,590,600 B2 | 7/2003 | Haas | |
| 6,868,100 B2 | 3/2005 | Larson et al. | |
| 6,879,605 B2 | 4/2005 | Kyusho et al. | |
| 6,901,090 B1 | 5/2005 | Ohtsuki | |
| 6,947,123 B1 | 9/2005 | Ohtsuki | |

(Continued)

FOREIGN PATENT DOCUMENTS

WO    WO 2008/014331 A2    1/2008

*Primary Examiner* — Samuel M Heinrich
(74) *Attorney, Agent, or Firm* — Knobbe, Martens, Olson & Bear LLP

(57) ABSTRACT

A laser system for processing conductive link structures includes a seed laser generating a seed laser beam. The seed laser is sliced by a modulator into a user configurable series of pulses and the pulses are optically amplified and applied to a conductive link structure. Preferably, the bandwidth of the seed laser is less than 1 nm with an IR center frequency, and the frequency of the laser light of the pulses is doubled or quadrupled prior to application to the conductive structure. Preferably, the pulses are about 1-18 nanosecond pulsewidth and are separated by 100-400 nanoseconds.

37 Claims, 4 Drawing Sheets

(56) References Cited

U.S. PATENT DOCUMENTS

| | | | |
|---|---|---|---|
| 7,157,038 B2 * | 1/2007 | Baird et al. | 264/400 |
| 7,348,516 B2 * | 3/2008 | Sun et al. | 219/121.61 |
| 7,535,631 B2 * | 5/2009 | Brown et al. | 359/341.1 |
| 7,711,013 B2 * | 5/2010 | Liu et al. | 372/6 |
| 8,106,329 B2 | 1/2012 | Gu et al. | |
| 2002/0005396 A1 | 1/2002 | Baird et al. | |
| 2002/0162973 A1 | 11/2002 | Cordingley et al. | |
| 2004/0134894 A1 | 7/2004 | Gu et al. | |
| 2004/0188399 A1 | 9/2004 | Smart | |
| 2006/0159138 A1 | 7/2006 | Deladurantaye et al. | |
| 2007/0038207 A1 * | 2/2007 | Mu et al. | 606/33 |
| 2007/0053391 A1 | 3/2007 | Oron et al. | |
| 2007/0248138 A1 | 10/2007 | Murison et al. | |
| 2007/0268942 A1 | 11/2007 | Murison et al. | |
| 2008/0080570 A1 | 4/2008 | Murison et al. | |

* cited by examiner

LASER PROCESSING OF CONDUCTIVE LINKS

CROSS REFERENCE TO RELATED APPLICATIONS

This application is a continuation of U.S. patent application Ser. No. 12/121,684, filed on May 15, 2008, entitled Laser Processing of Conductive Links; and also claims priority under 35 U.S.C. Section 119(e) to U.S. Provisional Application 60/938,967, filed on May 18, 2007.

BACKGROUND OF THE INVENTION

1. Field of the Invention

The invention generally relates to laser-based material processing, and more specifically to laser based modification of microscopic target materials, for example link structures of a semiconductor memory device.

2. Description of the Related Art

One important application of laser based micromachining is severing conductive links on memory integrated circuits to improve memory yield by switching functional memory cells for defective memory cells. Several aspects of such laser based memory repair are disclosed in the LIA Handbook of Laser Materials Processing", John Ready editor in chief, Laser Institute of America, Mongolia Publishing Co. Inc., 2001, Chapter 19, entitled "Link Cutting/Making" (hereinafter referred to as the "LIA-19"). LIA-19 discloses the use of conventional types of lasers for link blowing and memory repair, including diode pumped, solid state, q-switched lasers.

The assignee of the present application has developed a variety of laser systems for link processing, some of which are described in additional detail below. Reference is made to U.S. Patent Publication No. 2004/0188399 (hereinafter referred to as 'Smart'), entitled "Energy-efficient, laser-based method and system for processing target material," hereby incorporated by reference in its entirety, U.S. Patent Publication No. 2002/0167581 (hereinafter referred to as 'Cordingly et al et al'), entitled "Methods and systems for thermal-based laser processing a multi-material device," hereby incorporated by reference in its entirety, as well as U.S. Patent Publication No. 2004/0134896 (hereinafter referred to as to as 'Gu et al'), entitled "Laser Based Method And System For Memory Link Processing With Picosecond Lasers," also hereby incorporated by reference in its entirety.

Until recently, widely available commercial implementations of laser link severing machines have typically applied IR laser wavelengths in the 1.0 to 1.3 micron range to the links. In addition, pulse shaping, and pulse width selection have been beneficially applied to the links. As link width and pitch has become smaller over the years, implementation of shorter wavelength systems in the visible or UV ranges has begun to occur to take advantage of the smaller spot size that can be produced with shorter wavelengths. Laser processing with green light (e.g. about 500-550 nm) has been successfully performed commercially. UV laser processing machines have been developed, but high absorption at these wavelengths produces scattering, sensitivity to variations in dielectric layer thickness over the link, and other problems that have not been fully addressed to date.

Background information on shorter wavelength processing may be found in Muller et al, "Laser Process for Personalization and Repair of Multi-Chip Modules", SPIE Vol. 1598, *Lasers in Microelectronic Manufacturing*, 1991. Muller reported using 0.3 mJ, 50 nanosecond (ns) pulses from a frequency doubled q-switched solid state laser (532 nm wavelength) to cleanly remove 15 micron gold lines from a MCM device ("double pulse cut") without damaging an underlying polyimide layer.

In addition, U.S. Pat. No. 6,275,250 entitled "Fiber gain medium marking system pumped or seeded by a modulated laser diode source and method of energy control" (hereinafter referred to as the '250 patent) shows a fiber based MOPA system having a near IR semiconductor seed diode (1.1 micron wavelength) and multistage amplifier. FIG. 10 and the associated text of Cols 10-14 show the amplified output coupled to a frequency converter to produce a green laser output (550 nm) for marking, including marking of semiconductor (Silicon) substrates.

Research has also been ongoing regarding the effects of shorter pulses and groups of pulses for link processing. These developments have tended to increase the complexity, expense, and inefficiency of the laser source and related optical systems used to produce the laser energy incident on the links. Furthermore, various optical parameters of the laser beams are often difficult to control and are interdependent. Therefore, it can be difficult to optimize certain variables or to simultaneously optimize multiple laser beam variables and/or the performance of multiple optical components in the system.

Because laser systems have a wide variety of applications, research and development directed to addressing various undesirable aspects of laser performance has been ongoing for some time. For example, in Coldren et al, "*Diode Lasers and Photonic Integrated Circuits*", John-Wiley & Sons, 1995, Chapter 8, laser diodes having controllable gain, phase, and wavelength were analyzed. It was suggested an output modulator stage be used (rather than an output phase modulator) so that a diode laser can operate CW and the emitted lightwave is modulated external to the cavity. The main reason for the modulator PIC (Photonic Integrated Circuit) is that external modulation adds less wavelength chirp in the process of modulation, and the modulation can be higher than that of a laser which is optimized for tunability or some other purpose. Additional laser system embodiments are illustrated in U.S. Pat. No. 6,868,100 and U.S. Application Publication 2007/0053391.

Still, application of laser technology to link processing requires improvement in efficiency and ease of use, and further development is needed in the art.

SUMMARY OF THE INVENTION

In at least one embodiment laser-based material processing of memory links or similar target structures is carried out at near IR, visible, or UV laser wavelengths. In accordance with some embodiments of the present invention high conversion efficiency of IR sources to short wavelengths is achieved, with improved control of the temporal characteristics of one or more processing pulses that are to impinge a target structure.

Embodiments of the present invention generally provide for highly-efficient, short wavelength laser based processing of memory links or similar microscopic target structures using pulses having controlled temporal characteristics.

In one embodiment, the invention comprises a method of laser-based material processing comprising generating a laser beam having a narrow emission spectrum characterized by a full width at half maximum intensity of less than about 1 nanometer during a first time interval, controllably modifying a characteristic of the laser beam during the time interval to produce one or more pulses without substantially broadening the emission spectrum, and delivering and focusing at least one of the one or more pulses onto at least one target structure during motion of the at least one structure relative to the at least one pulse.

In another embodiment, a method of severing conductive links on an integrated circuit comprises generating a substantially continuous narrowband laser beam characterized by a full width at half maximum intensity of less than about 1 nanometer, modulating the substantially continuous narrowband laser beam to produce one or more narrowband laser pulses, amplifying the narrowband laser pulses, shifting the center wavelength of the narrowband laser pulses, and applying the amplified and shifted laser pulses to one or more conductive links.

In another embodiment, a method of severing conductive links on an integrated circuit comprises producing a time separated plurality of narrowband laser pulses characterized by different center wavelengths, selecting one or more of the time separated plurality of narrowband laser pulses, amplifying the selected one or more narrowband laser pulses; shifting the center wavelength of the narrowband laser pulses, and applying the amplified and shifted laser pulses to one or more conductive links.

In another embodiment, a system for processing links in or on an integrated circuit comprises a laser light source configured to output laser light having a full width at half maximum intensity of less than about 1 nanometer, a modulator configured to receive the laser light and modulate the laser light to produce one or more laser light pulses, an amplifier configured to amplify the laser light pulses, a wavelength shifter configured to shift the center wavelength of the laser light pulses, and a beam delivery and focusing system configured to receive the amplified and shifted pulses and apply one or more of the amplified and shifted pulses to one or more conductive links.

In another embodiment, the invention comprises a method of processing conductive target structures on and/or embedded in one or more dielectric and/or semiconductor materials. This method includes moving a laser beam spot over a series of conductive target structures in a one or two dimensional array of conductive target structures and generating a first laser pulse having a pulse width of more than 100 ns. At least a portion of the first laser pulse is divided into at least 100 approximately equal time slices, a laser beam attenuation for each of the time slices is selected, and the laser pulse is attenuated in accordance with the selecting to produce at least two output laser pulses, each laser pulse being separated from the other laser pulses by at least 100 ns. The at least two laser pulses are applied to a conductive target structure during the moving.

In another embodiment, a system for laser processing conductive target structures on and/or embedded in one or more dielectric and/or semiconductor materials comprises a seed laser producing a substantially continuous laser beam output, means for defining an attenuation value for each of a series of approximately equal time slices of the substantially continuous laser beam output, means for attenuating time-wise portions of the substantially continuous laser beam output in accordance with the defining to produce a series of approximately square shape pulses having user defined widths and amplitudes, an optical amplifier configured to amplify the series of approximately square shape pulses, and an optical beam delivery system configured and positioned to apply the amplified series of approximately square shape pulses to the conductive target structures.

In another embodiment, a method of processing conductive target structures on and/or embedded in one or more dielectric and/or semiconductor materials comprises selecting at least two of pulse amplitude, pulse energy, and pulse width for a substantially square shape main processing pulse, selecting at least two of pulse amplitude, pulse energy, and pulse width for a substantially square shape cleaning pulse, selecting an interpulse interval between the substantially square shape main processing pulse and the substantially square shape cleaning pulse, slicing a single long pulse to produce the selected pulses with the selected interpulse interval, and applying the selected pulses to one or more of the target structures.

In another embodiment, a method of processing conductive target structures on and/or embedded in one or more dielectric and/or semiconductor materials comprises applying two or three laser pulses to the target structure, each of said pulses having a pulse width of about 1 to about 18 ns, wherein each pulse is separated from the other pulses by 100 to 400 ns, and wherein the applying is performed during a single on-the-fly pass of a beam spot over the conductive target structure.

DETAILED DESCRIPTION OF THE INVENTION

Embodiments of the present invention generally provide for highly-efficient processing of target structures using nanosecond or shorter pulses having controlled temporal characteristics. Although particularly adapted for processing with short laser wavelengths, some embodiments may provide for efficient processing at near IR wavelengths, or optionally processing with a combination of near IR and short wavelengths.

Figure 1:
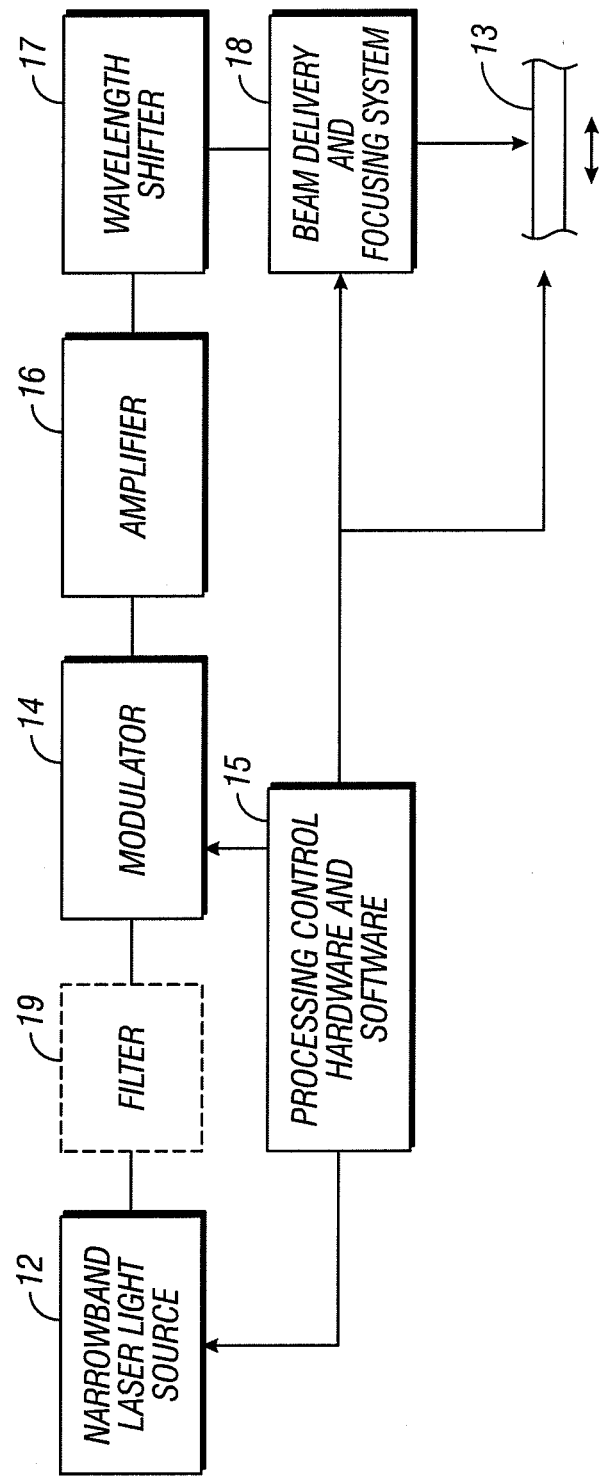
FIG. 1 is a schematic illustrating an embodiment of a link blowing system in accordance with some aspects of the present invention.
Figure 2A:
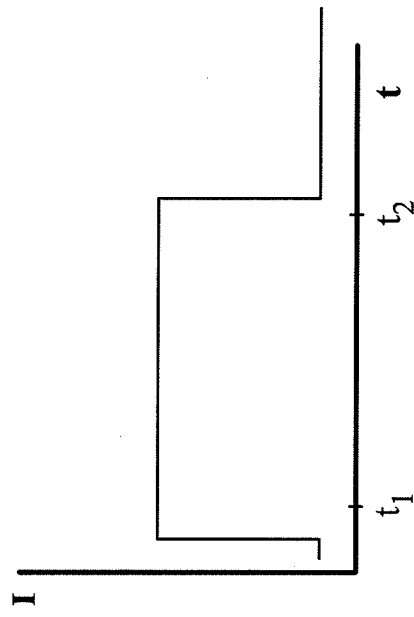
FIGS. 2A-2D illustrate laser light temporal and wavelength characteristics in the system of FIG. 1.
Figure 2B:
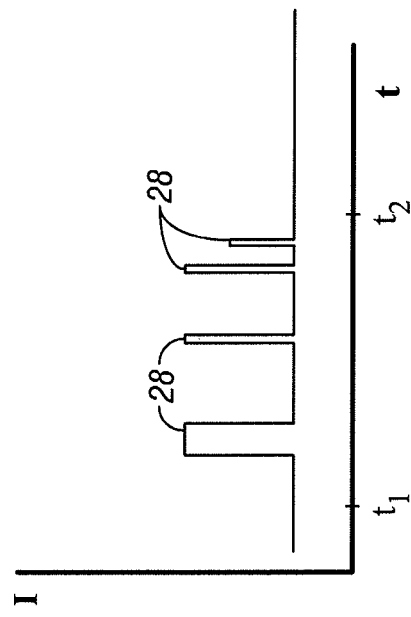
Figure 2C:
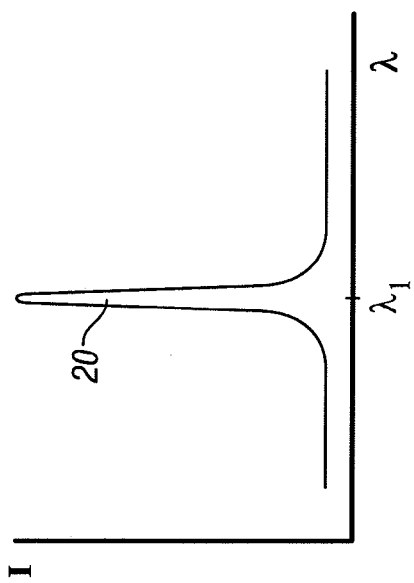
Figure 2D:
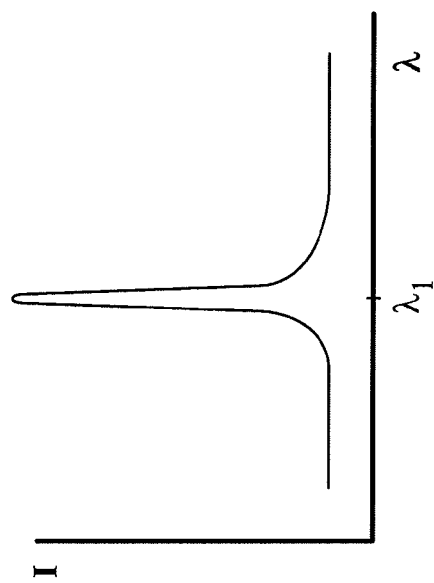
Figure 3:
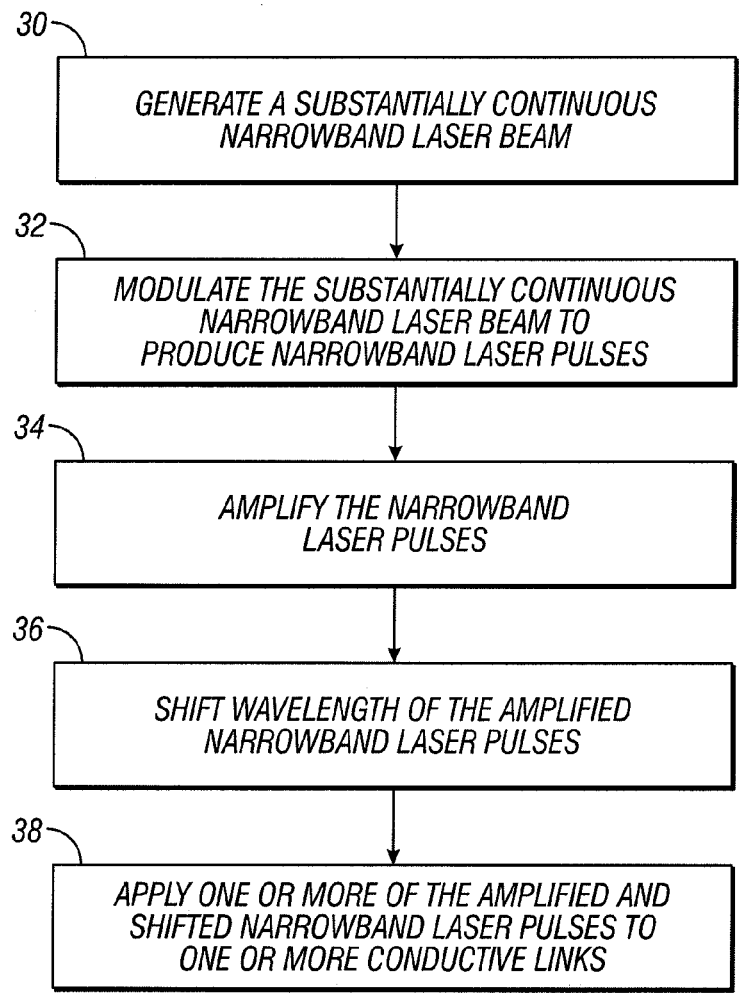
FIG. 3 is a flow chart of a link blowing method in accordance with some aspects of the invention.

FIGS. 1, 2, and 3 illustrate one embodiment of a link severing method and system incorporating some aspects of the present invention. In the following paragraphs reference is made to laser spectral characteristics, e.g.: wavelength and spectrum. Unless otherwise stated the terms are regarded as conventional, interchangeable and non-limiting terms of art. For example, a laser wavelength is often referred to in typical laser specification sheets as a "central wavelength", "central emission wavelength". The spread about the wavelength is often referred to as the "wavelength spectrum", "emission bandwidth", "emission spectrum", or "spectral bandwidth" and is commonly characterized by the full-width-at half maximum (FWHM) of distribution of emitted power as a function of wavelengths. By way of example, the emission spectrum of a "narrowband" source as referred to herein may be well below 10 nm, for example less than about 1 nm, and is preferably 0.25 nm or less. In some embodiment, bandwidth is controlled to less than 0.1 nm. FIGS. 2A and 2C for example are schematic illustrations showing narrow spectra.

Referring to FIGS. 1, 2 and 3, a method of high-efficiency laser based processing a target structure may include first generating a narrowband laser beam (block 30 of FIG. 3) with a laser light source 12. The laser beam may in some embodiments be a substantially continuous output. As used herein, the term "substantially continuous" means the laser source 12 is operated continuously during a link severing operation. The link severing operation itself may involve the severing of a single link or multiple links, and the laser operation may be considered "substantially continuous" if the laser on-time is long enough to span the processing of at least one link. This will generally require a laser source on time of at least about 100 nanoseconds, and may be 500 nanoseconds, 1 microsecond, or longer depending on the application and characteristics of the laser source. In some advantageous embodiments, the on time corresponds to a pass of the beam along a row or column of links on a wafer being processed, and will thus have an on time spanning the processing of tens or hundreds of links. It will therefore be appreciated that the laser source may be turned off between link severing operations and still be within the scope of the term "substantially continuous."

One benefit of embodiments where the laser source is substantially continuous is that the laser source may output a narrow emission spectrum. This is especially true for laser diodes which tend to have broad emission spectra when modulated at high rates. For some laser source embodiments, higher direct modulation rates on the laser can be used (such as near GHz rates or higher), and the narrow spectral width can be achieved, for example, by placing wavelength selecting elements within a seed laser cavity. In the case of a fiber seed laser, this element could be Bragg gratings or other elements having high wavelength selectivity.

In at least one embodiment a laser source emits wavelengths in the range of about 1 micron to about 1.55 microns, with a narrow emission spectrum of about 1 nm or less during at least a portion of a pulse duration. FIGS. 2A and 2B illustrate characteristics of the laser light emitted from the source 12. The emission spectrum of a pulse has a narrow range 20 of laser wavelengths during at least a portion of a time window denoted as the time between times $t_1$ and $t_2$ of FIG. 2B. If the time period between times $t_1$ and $t_2$ of FIG. 2B is sufficient to process at least one link (e.g. 100 nanoseconds or more) with a stable and narrow bandwidth output, the source is considered substantially continuous narrowband laser light source as described above.

The source 12 may include a semi-conductor laser or diode pumped solid state laser. In accordance with an embodiment of the invention, the emission spectrum of the emitted seed output is to be narrow so as to allow for efficient frequency conversion. As noted above, a typical FWHM less than 1 nm is considered acceptable, and preferably much less, during a substantial fraction of the seed pulse duration.

In embodiments where a semiconductor laser is utilized, the source 12 of FIG. 1 may provide for reduced spectral width (FWHM) compared to standard laser diodes. Primary application and emphasis over the past several years for such laser sources relates to high speed telecommunications and ultrafast photonics. A commercially available DBR or other type of semiconductor laser may, for example, provide suitable available average power, total pulse energy, and a pulse width of 100-1000 nanoseconds.

Commercially available diode laser assemblies may include a thermo-electric cooler to control wavelength drift with temperature. In some embodiments a multimode laser diode may be used with a TE cooler to stabilize the central wavelength over temperature. Further, the spectrum of certain laser diodes may be sufficiently narrow during a portion of pulse duration if operated with substantially constant current/power during that time interval.

In yet another embodiment a q-switched source may be utilized as a seed source (for a relatively short pulse width), wherein the output may be modified/stretched to produce a particular output waveshape for further modification with modulator 14 before seeding amplifier 16. Typical q-switched solid sources include NdYVO4, YLF, and YAG sources.

In at least one embodiment a laser source 12 may include at least one of a semiconductor diode laser, a diode pumped fiber laser oscillator, q-switched laser, or other suitable solid state laser. The source may include at least one intra-cavity or extra-cavity element having wavelength selectivity, and useable to produce the narrow emission spectrum. For example, an integrated Bragg reflector as an HR (high reflectivity mirror) and/or OC (output coupler) may be used to limit the spectral bandwidth to the narrow wavelength range. An HR or OC may include a bulk grating or/and etalons alone or in combination with an integrated element having high selectivity.

As shown in FIG. 1, separate spectra narrowing element(s) 19 may additionally be used in between the seed laser 12 and the external modulator 14 to further narrow the bandwidth of the laser light entering the modulator 14.

In one embodiment a fiber laser oscillator may be utilized as a seed source, and operated in a quasi-CW or gain switched (pulsed pump) mode. The laser oscillator may be formed using Bragg grating reflectors, or other suitable elements having high wavelength selectivity, to provide both HR and OC mirrors and also to limit the output wavelength spectrum. By way of example, further details regarding early work with fiber lasers are shown in U.S. Pat. No. 5,666,372 and the publication by Zurn et al, "Line Narrowing and Spectral Hole Burning in Single-Mode $Nd^{3+}$ fiber lasers", *Optics Letters*, Vol. 12, No. 5, May 1987.

At block 32 of FIG. 3, the output of the laser source is controllably modified by, for example, modulator 14 of FIG. 1 to produce one or more modified pulses 28 (FIG. 2D) without substantial broadening of the emission spectrum, as shown in FIG. 2C. The modulator may be a Mach-Zehnder electro-optic modulator, an electro-absorption modulator (EAM), waveguide modulator, or other similar device to produce one or more pulses having a pulse width in an exemplary range of about a few picoseconds to about 30 ns. At least one pulse will have a non q-switched output pulse shape.

Modulator 14, under control of processing control hardware and software 15, controllably modifies the seed output waveform to produce one or more pulses having at least one of a pre-determined pulse shape, pulse width, pulse energy, peak pulse power, and temporal spacing. As shown in FIG. 2D, multiple pulses of controllable width, peak intensity, and shape can be produced from the substantially continuous laser beam by controlling the modulator 14. In many advantageous applications of the system of FIG. 1, a burst of multiple pulses output by the modulator 14 over a 10 to 1000 nanosecond period (sliced from a substantially continuous seed laser output) are all applied to a single link in an on-the-fly link severing process. Sub-microsecond duration bursts will exit the modulator at rates of 1 kHz or more, selectively severing links with the bursts of pulses.

Modulator 14 is provided to controllably modify the seed pulse shape/waveform to produce pulses having at least one of a pre-determined shape, pulse width, rise time, or other suitable temporal characteristic. Typically, rise times/durations from sub-nanosecond to a few tens of nanoseconds are useful for link processing. An integrated electro-optic modulator having a GHz bandwidth is preferred, for example a Mach-Zehnder modulator. The operation is well known. For example the principles of operation are disclosed in Saleh et al, Photonics, Chapter 18, pgs 702-703, John Wiley & Sons, 1991. Commercially available modulators are available from JDS Uniphase and other manufacturers. Alternative embodiments may be practiced with conventional Electro-Optic modulators (pockels cells) having suitable rise times, repetition rates, and duty cycles. High voltage drivers are generally used for conventional Pockels cells. Yet another type of high speed-modulator is a planar waveguide modulator which also operates by the electro-optic effect.

In at least one embodiment the seed laser and modulator may be an integrated unit. Coldren et al, "*Diode Lasers and Photonic Integrated Circuits*", John-Wiley & Sons, 1995, Chapter 8, discloses various arrangements. In some embodiments a modulator may be a semiconductor modulator operating as an EAM (electro-absorption effect) and fabricated as an output modulator section coupled to the laser gain section.

In other such embodiments an integrated phase modulator may be converted to an integrated Mach-Zehnder intensity modulator. Developments in Photonic Integrated Circuits (PICs) and telecommunications may provide for integrated circuits or compact modules.

Advantageously, the modulation can be defined through electronic hardware and software controls. For instance, a 1000 bit memory register may store modulation information where each bit represents 1 ns of a 1000 ns seed laser output pulse, where a bit value of 1 may represent pass the light and 0 may represent block the light. In this example, a large variety of pulse sequences can be generated and manipulated within an original 1000 ns pulse from the laser source 12. For example, one can have two pulses, each having a pulse width of 20 ns and the separation between them can be anywhere between 1 ns to 960 ns. One can also have three pulses with different separations, and so on so forth. The combination of number of pulses and separation of the pulses is many as long as the condition is met that all pulses and their separations are within the overall packet envelop—e.g., 1000 ns. More refined modulation can be defined by more detailed modulation information, if, for example, multiple bits are used for each nanosecond defining an attenuation value for one or more nanoseconds of the original 1000 nanosecond pulse. It will be appreciated that 1000 slices of a 1000 ns pulse is one example, and many variations on this theme are possible Generally, it is advantageous for the pulse to be more than 100 ns long divided into 100 or more slices.

Because of the ease of use and flexibility, laser processes will benefit from this type of laser pulse producing system. For example, not only can one select the number of pulses, the pulse width and pulse energy of each individual pulse can be selected independently of each other. Moreover, the separation between pulses can be also individually selected. The separation of any two adjacent pulses can be individually set independent of any other two adjacent pulses. An arbitrary pulse shape and a pulse train can be easily programmed and generated. Slices of several hundred ps, or 100 ps, or even less could also be used with an appropriate modulator to produce shorter pulses than 1 ns.

Another benefit of this pulse generation system is that the important pulse train parameters are easy to control. This may be contrasted with recent attempts at providing control of the output pulse shape with various customized laser configurations and pulse combining techniques to provide shaped laser pulses. Flexible pulse shaping may appear beneficial as spiked pulses, ramped pulses, as well as various combinations of these could theoretically be produced easily and applied to the workpiece. However, in the field of link processing, the applicant has correlated simple substantially square pulse shapes to improvements in yield or processing energy window. The present system with 1 ns slices with some amplitude control for each slice provides a simple system interface for generating sets of pulses that still allows full control over the important pulse train parameters.

Although substantially arbitrary pulse shape control is possible, it has been found useful to provide a relatively small number of pulses with a higher energy first pulse and one or more lower energy "cleaning" pulses following the first pulse. Recent experiments performed by the applicant have shown that an appropriately defined set of two or three pulses are especially advantageous for a variety of fine pitch link arrays, as it has been found that a common failure mode of the link blowing operation is the leaving of residual material at the link site after a single pulse. Single pulse processes that have enough energy to eliminate this failure mode are at risk for causing substrate and neighbor link damage. It has been found that a two or three pulse series with lower energy per pulse can clean all residual material with less damage to the substrate and surrounding structures, improving yield and processing energy window. A reduction in the low end of the energy window has been observed, and it appears possible that the total energy applied to the link with an optimized two or three pulse set can sometimes be reduced over the optimal single pulse energy.

The first pulse of this pulse series is referred to herein as the main processing pulse. The subsequent pulses are referred to herein as the cleaning pulses. It has been found acceptable to use substantially square pulses without attempting to add spikes or other shape varieties. Spot shape and size may advantageously be the same for all pulses of the set. As used herein, a substantially square temporal waveform means a variation in amplitude of ±20% or less from a mean amplitude, with rise and fall times of less than 10% of the pulse width (full width at half maximum) or less than 0.5 ns, whichever is greater.

Use of the above described modulated laser system may therefore proceed by selecting parameters for a main processing pulse. These parameters will generally include two of three defining parameters: pulse width, pulse amplitude, and total pulse energy. It has been found advantageous for many current link designs for the energy of the entire pulse series to be 20 to 100 nanojoules, which means the first pulse energy may advantageously be in the range of about 7 to about 50 nanojoules depending on how many pulses are to be used. Pulse widths (defined as full width at half maximum height) are preferably less than about 18 ns, more preferably 5 ns or less, and even more preferably 1 ns or less for fine pitch links. Next, or at the same time, parameters for one or more cleaning pulses are selected in the same way. Preferably, cleaning pulse energies are 30-60% of the main processing pulse energy. It has been found acceptable to use the same width for the cleaning pulses as the main processing pulse.

Interpulse spacing (time from the end of one pulse to the beginning of the next) is also selected. Relatively long interpulse spacings have been found especially useful, with at least 100 ns being preferable. More preferable is at least 190-200 ns between pulses. There may be a few reasons for this. One is that simulations show that the substrate cools faster than the link in the period immediately after the first pulse ends. Thus, an appropriate wait time can more easily produce increased heating to the link without excessive heating of the substrate. Another possible reason is the plume of material that is generated over the link following the first pulse. Although much of this ablation plasma dissipates within 20 or 30 ns, some residual cloud appears to remain for 100 ns or more.

Interpulse spacings that are too large can also have some disadvantages because the link can cool nearly all the way to room temperature prior to the next pulse. It is more effective if the remaining material is still hot from the first pulse when the second pulse is applied. Generally, interpulse spacings of less than 400 ns have been found preferable. Because it is advantageous to apply all the pulses of the burst to a link as the link moves through a single on the fly pass of the workpiece, long interpulse spacings can cause the beam placement on the link to shift from the first pulse to the last. For total burst lengths of 500 ns or less, this is typically not a significant problem. However, if desired or necessary, longer interpulse spacings can be accommodated by using a deflector or multiple beams (see, for example, FIGS. 19 and 20 and associated text of U.S. Patent Publication No. 2002/0167581, incorporated herein by reference).

Experimentation on test links may be performed to optimize the pulse set within these constraints. Excellent results for one link array have been produced with three pulses of 15 ns width, the last two being about 50% of the energy of the first, with about 200 ns interpulse spacing. Excellent results for 1.0 to 1.6 micron pitch copper links have been obtained with two or three 10 ns pulses each separated by 190 ns. In these experiments, the total energy applied to each link was 100 nanojoules regardless of whether two or three pulses were used, and each of the cleaning pulses had 50% of the energy of the main processing pulse. Tighter pitch links of 0.95, 0.85 and 0.75 micron pitch have also been processed with good results using the above techniques with a double pulse of 10 ns pulse width for each pulse. Light of 532 nm was used with spot sizes of 0.8 to 0.9 micron. IR wavelength processing is expected to benefit from the above described principles as well.

Importantly, the laser system described herein provides an excellent platform for defining and optimizing such pulse trains.

Another important benefit of this external modulation discussed further below is that it allows the spectrum width of the laser output to be very narrow, which in turn makes it an efficient fundamental source for the harmonic generations. The additional advantages of having a narrow line width laser source include benefiting the imaging optics and operation of other optical components, including diffractive optical elements and diffractive scanners.

In at least one embodiment a modified pulse having the narrow range of wavelengths is within a wavelength range suitable for amplification with at least one diode-pumped solid state optical amplifier 16. The method may include amplifying the one or more pulses with the amplifier to produce one or more amplified pulses, wherein a step of amplifying is carried out prior to a step of wavelength shifting. Thus, as illustrated in FIG. 1, the modulator output is directed to laser amplifier 16 for amplifying the pulses from the modulator 14, as also set forth in block 34 of FIG. 3. The amplifier may include multiple amplifier stages, for example in a diode pumped Ytterbium or Erbium doped fiber amplifier configuration. In at least one embodiment a diode pumped solid state optical amplifier may be at least one of a diode pumped Erbium and Ytterbium doped fiber optic amplifier operating in the range of about 1 µm to 1.55 µm.

Optical amplifier 16 of FIG. 1 may be a fiber optic amplifier. Smart, Cordingley et al, Gu and citations therein disclose various alternatives. The number of stages will generally be determined based on the available energy of modulated pulses at the output of modulator 14, which in turn depends on the energy and power characteristics of seed laser 12. If, for example, seed laser output is compressed or sliced to produces a pair of 10 nanosecond pulses the total pulse energy will be ×100 that of a pair of 100 ps pulses sliced from source output (+20 dB greater).

One or more pulses at the amplifier output propagate to a wavelength shifter 17, for example a frequency doubler, tripler, quadrupler, or a Raman shifter for example. The step of shifting as set forth in block 36 of FIG. 3 may shift the wavelengths of the one or more amplified pulses to a near IR, visible, or UV wavelength to produce one or more short wavelength output pulses. Harmonic converters, including frequency doublers and triplers, are conventional wavelength shifting devices for producing short wavelength from a longer IR source wavelength. U.S. Pat. No. 6,275,250 entitled "Fiber gain medium marking system pumped or seeded by a modulated laser diode source and method of energy control" (noted in background section) illustrates frequency doubling in a fiber-based MOPA system. FIG. 10 of the '250 patent illustrates conversion from 1.1 µm to 550 nm outputs.

It is well known that conversion efficiency of harmonic converters is approximately linear with input power density. It is also true that harmonic converters are most efficient when converting narrowband input sources, although the relationship between input bandwidth and conversion efficiency is more complex. This is one aspect of visible and UV link processing systems that has not been appreciated or received sufficient attention prior to the present invention. As desired pulse widths get shorter, e.g. under 10 nanoseconds and even into the picosecond range, increases in instantaneous power per pulse may also be desired. If a harmonic converter is used to produce shorter wavelength radiation, it can be a significant source of pulse energy loss in the laser generation system. Increasing the power applied to the harmonic converter will increase efficiency, but this is not necessarily a desirable solution, as this increases the amplification needed in the amplifier, increasing noise and reducing amplitude stability. Furthermore, this can also reduce the useful lifetime of the harmonic converter device, as the crystals used in such devices are subject to degradation over time due to dissipating beam energy in the conversion process.

Second harmonics conversion efficiency is given by the following $$\eta = \text{Tan } h^2 \{LK^{1/2}(P/A)^{1/2} \sin(\delta\kappa L/2)/(\delta\kappa L/2)\} \quad (1)$$

Where
L is the length of the nonlinear crystal
A is the area of the fundamental beam
K is frequency and material related parameter. For a given wavelength and a given nonlinear material, K is a constant.
P is the power of the fundamental beam, and $$\delta\kappa = 4\pi(n_1 - n_2)/\lambda_1 \quad (2)$$

$n_1$ and $n_2$ are index of refraction for fundamental and second harmonics, respectively. $\lambda_1$ is the fundamental wavelength. Equation (1) can be reduced to the following if the efficiency is low $$\eta = L^2 K(P/A) \sin^2(\delta\kappa L/2)/(\delta\kappa L/2)^2 \quad (3)$$

So when δκ changes, the efficiency changes too. It will be reduced to one-half of its peak value when $$\delta\kappa L/2 = 1.39 \quad (4)$$

Therefore, when the spectral line width of the fundamental beam is finite, i.e., there are some small wavelength changes around the central wavelength $\lambda_0$ at which phase matching occurs, one can estimate its impact on the harmonic conversion efficiency by first expanding $$n_1 - n_2 = (dn_1/d\lambda_1 - 0.5 dn_2/d\lambda_2)(\lambda - \lambda_0) \quad (5)$$

From equations (2)-(5), one can derive that the doubling efficiency drops to one-half when the deviation of the wavelength from the phase-matching wavelength $\delta\lambda = (\lambda - \lambda_0)$ reaches the following value $$\kappa\lambda = 0.22\lambda_1/L(dn_1/d\lambda_1 - 0.5 dn_2/d\lambda_2) \quad (6)$$

Therefore, the spectral line width of the fundamental beam has a significant impact on the conversion efficiency. For example, if the wavelengths are on the order of a 1000 nanometers, and the crystal length is on the order of a centimeter, typical index dependencies on wavelength can result in a significant efficiency drop with source bandwidth greater than 0.1 nm in many cases. Careful control of laser light bandwidth entering the converter is therefore important in a link processing environment. Preferably, the conversion efficiency is greater than 40%, which can be achieved at relatively high power density and narrow input bandwidth.

In some embodiments laser source 12 may have a convenient wavelength of about 1.0-1.55 microns, such as disclosed in Gu et al. In some embodiments the longer wavelengths in the 1.3-1.55 microns are useful because fiber amplifier and source technology is well developed at those telecommunication wavelengths. Doubling of such wavelengths to about 0.65-0.75 µm may provide for improved link processing at short wavelengths, providing for finer pitch processing with one or more pulses. Operation at green or UV wavelengths is generally obtained with further frequency conversion (e.g.: a tripler or quadrupler, the latter may be a pair of frequency doublers). To get the shorter wavelengths, such as UV range, two converting crystals are generally required. In this case, the benefits of the narrowband source and external modulation are expected to be significant, even more so than a system with a final laser output wavelength in the visible range.

Other wavelength shifting methods include four-wave mixing, upconversion, Raman and Stokes conversion and optical parametric conversion. These other techniques may also benefit from the narrowband source. A stabilized narrowband source 12 therefore provides for additional benefits and mitigates some currently problematic design challenges to provide stable operation over time and temperature.

The wavelength converted output pulses are then received by a delivery and focusing system 18 that produces diffraction limited or nearly diffraction limited spots at a selected target structure during motion of the structure relative to the pulses (block 38 of FIG. 3). In some embodiments (not shown) a plurality of pulsed beams may be simultaneously or sequentially directed multiple target structures as exemplified in Cordingley et al (e.g.: at least FIG. 20 and the corresponding text).

As to beam delivery and focusing systems 18, reference is made to U.S. Application Publication 2004/0134894 to Gu et. al and references cited therein for exemplary arrangements (e.g.: at least FIG. 9 and the associated text, and paragraphs 0167-0177). Reference is also made to U.S. Patent Publication 2004/0162973 to Cordingley et al (e.g.: at least FIGS. 19-20, and associated text), and also U.S. Patent Publication 2004/0188399 to Smart (at least FIG. 7 and associated text). Various combinations and modification of the exemplary arrangements may be made to practice various alternative embodiments of the present invention. Short wavelength processing is generally carried out with approximately diffraction limited spots and a focused spot size being in a range of about 0.5 µm-1.5 µm for visible or near IR operation (e.g.: 400-800 nm, 500 nm, 532 nm, or 750 nm operation). The spots may have a non-uniform or substantially uniform spot intensity distribution. The spot shapes may be circular, or shaped as elliptical Gaussian spots, "top hat", or combinations thereof. One or more spatially separated spots may be delivered to a link along a pre-determined direction.

Pulse energy characteristics (e.g.: pulse width, pulse energy, peak pulse power, pulse spacing) suitable for link processing are generally disclosed in smart, Cordingley et al, and Gu. Pulse widths for processing are generally in the range of picoseconds to about 20 ns, pulse energies in the range of about 1 nJ to 1 uJ, and peak pulse powers in the range of about $10^9$ W/cm$^2$ to $10^{12}$ W/cm$^2$.

Figure 4:
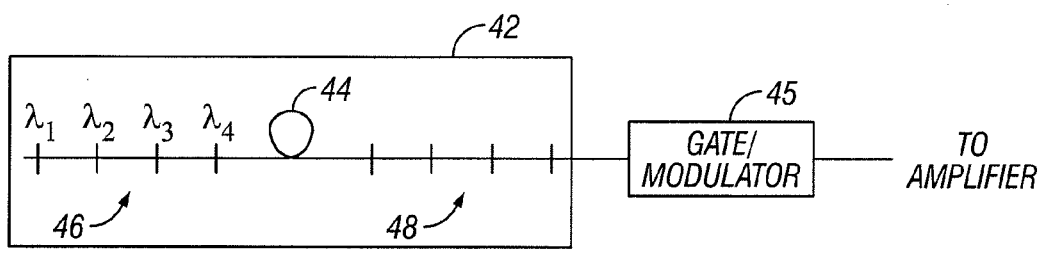
FIG. 4 is an alternative embodiment of a laser light source suitable for use in the present invention.
Figure 5A:
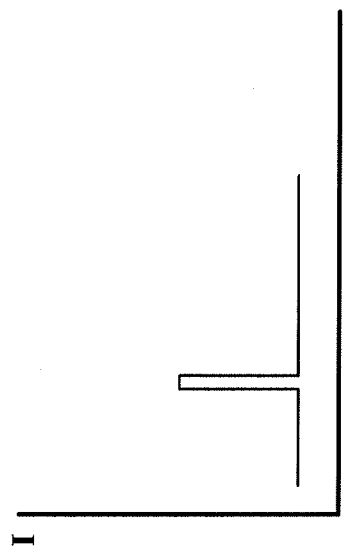
FIGS. 5A-5D illustrate laser light temporal and wavelength characteristics in the system of FIG. 4.
Figure 5B:
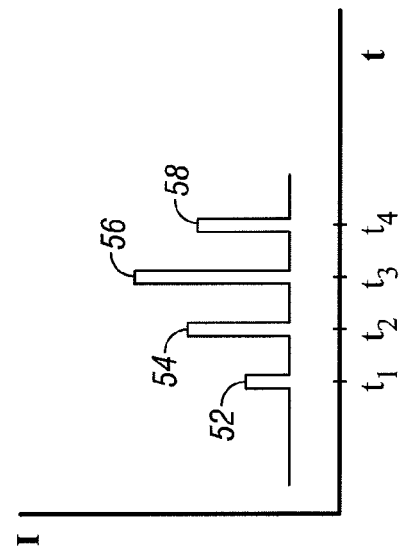
Figure 5C:
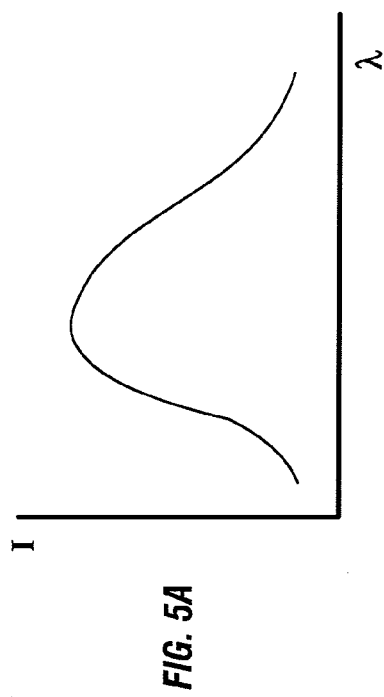
Figure 5D:
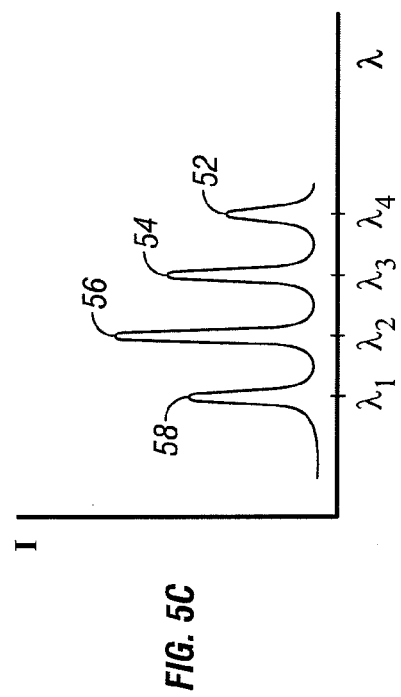

An alternative laser arrangement for producing narrowband laser pulses is illustrated in FIGS. 4 and 5. This embodiment comprises a fiber laser 42 having a fiber element 44 and wavelength selective elements 46, 48 such as a spatially oriented series of Bragg gratings or filters and mirrors with different coatings for different reflection characteristics of different wavelengths. In the absence of the shifted gratings, the intensity of a generated pulse such as shown in FIG. 5B may be relatively broadband as shown in FIG. 5A. However, because different wavelengths from the seed laser are reflected at different gratings or filters at different times, and they are traveling along the fiber with delays in time among pulses with different wavelengths. This produces a series of narrowband time separated pulses 52-58 with different center wavelengths. Therefore, by timing the gate or modulator right, a certain wavelength with a certain bandwidth can be selected, blocked, attenuated, and/or shaped by the gate/modulator 45. This technique would provide laser light with a narrowed spectral line width before their amplification through the amplifiers and subsequent wavelength shifting as described above with reference to FIGS. 1 through 3.

This invention will provide improved laser processes and advantages based on this laser technology. Application advantages would include at least the following: better process control, better process window, better precision, better efficiency, better energy coupling into the target materials, accelerated process development, multiple process workstations with each station having its own pulse shape, pulse width, pulse numbers, and pulse energy.

Link blowing systems having advantageous pulse characteristics and including additional useful features or components are described in U.S. Patent Publication 2004/0188399 ("Smart"), U.S. Patent Publication 2002/0162973 ("Cordingley"), U.S. Patent Publication 2004/0188399 ("Gu"), and U.S. Ser. No. 11/699,297 ("Lee") Lee, all assigned to the assignee of the present invention and incorporated by reference herein. The pulse parameters, optical systems, and laser light generating and directing devices, components, and techniques described in these references are compatible with and could be used with the narrowband laser light inventions described in this application.

Lee provides extensive information regarding generation and shaping, pulse spatial and temporal characteristics, and material interaction mechanisms for processing memory links or similar microscopic target structures using one or more pulses. Lee discloses pulse energy characteristics found to be suitable for short-wavelength laser-based link processing. As the link widths, pitch, and spot size decrease less total energy is required for a given energy or power density at the link. Although the trend increases optical design requirements, the burden is decreased somewhat for laser/amplifier/shifter designs. Hence, energy losses associated with modulation (e.g.: slicing) of the beam are much less severe a limitation than with previous larger spot sizes. For example, a spot size reduction from 4 microns to 1 micron reduces the total energy required by about 16-times. Similarly, the absorption of many target structures also increases at shorter wavelengths lower energy may be used (as taught in U.S. Pat. No. 6,911,622, assigned to the assignee of the present invention and incorporated by reference herein).

Smart generally discloses pulse generation and shaping, including non-conventional (non q-switched) pulses for link blowing and other micromachining applications. Referring to FIGS. 5-7 of Smart and corresponding text, at least one embodiment includes a semiconductor seed diode, a fiber optic amplifier, and output modulator/attenuator. The seed diode and modulator are computer controlled. In at least one embodiment the laser diode is controlled (directly modulated) to produce one or more pulses. The pulses may have a square or sawtooth pulse shape. The fast response of the laser diode also provides for generation of a sequence of pulses in rapid succession, for example pulses of variable width. The system of FIG. 7 of the Smart publication shows numerous elements of a complete link blowing system, including an electro-optic or acousto-optic modulator to select material processing pulses, exemplary arrangements for beam delivery and focusing, and motion control. Smart discloses pulse widths from several picoseconds to about 10 nanoseconds (and the longer pulse widths of earlier link blowing references, e.g.: 10-50 ns), pulse energies up to the microjoule range, and focused spot sizes in the range of about 1-4 microns. In Smart, a laser pulse is generated to provide a substantially square pulse shape with pulse duration in the range of about 2-10 nanoseconds and a rise time of about 1 ns and preferably about 0.4 ns.

The MOPA configuration of Smart is relatively new and pulsed versions are regarded as state of the art. The laser diode which has sub-nanosecond rise time in response to a modulating drive waveform is a starting point in the fiber laser MOPA configuration, with the laser diode as a gain element. The laser diode generally has multiple longitudinal modes and the sub-system can be configured for single mode operation or otherwise tuned with bulk components at the output or, alternatively, with integrated fiber gratings in the system.

For instance, the Littman-Metcalf grating configuration described in product literature by New Focus Inc., in the external cavity configuration, is a viable configuration. FIG. 6b shows a schematic of a single frequency laser with external cavity tuning and also includes an optical fiber pumped at its cladding by diode laser pump. Other diode laser alternatives include distributed feedback lasers (DFB) and distributed Bragg lasers (DBL) which have integrated gratings and waveguide structures, some cases with external controls allowing the user to independently control the gain, phase, and grating filter. See FIG. 6a for a DBL configuration including a coupler 50. This provides flexible mode selection and tuning capability. The laser frequencies can be dynamically selected with a number of the configurations by adjustments of the bulk components, such as the grating and/or mirrors of the external cavity, or, alternatively, a fixed wavelength or mode chosen. The range over which the diode central wavelength can be selected is impressive overall, from less than 1 micron to about 1.3-1.5 micron or longer, the latter wavelengths corresponding to those used for fiber optic communication.

Preferably, the repetition rate is at least 1000 pulses/second and each of the amplified pulses has at least 0.1 and up to 3 microjoules of energy.

Optically amplifying is preferably carried out with a fiber optic amplifier that provides a gain of at least 20 DB.

A laser amplifier for optically amplifying a pulse train is disclosed therein. The pulses are to be amplified without significantly changing the predetermined shape of the pulses to obtain an amplified pulse train.

Low distortion is an important characteristic of the fiber amplifier. Low distortion allows the output pulse shape to substantially match the seed laser pulse shape or possibly further enhance the pulse edges or uniform power shape. The fiber optic gain medium produces the amplifier pulse of FIG. 5 which is delivered to the optical system and focused onto the object.

Multiple fiber amplifiers can be cascaded for further gain if desired, provided the distortion is low. It could be advantageous to provide active optical switches or passive optical isolators at the output of intermediate stages to suppress spontaneous emission. These techniques are known by those skilled in the art and are disclosed in U.S. Pat. No. 5,400,350 and WO 98/92050, for example.

Smart discloses using a laser having a wavelength suitable for laser processing while avoiding damage to surrounding materials. The system includes a laser source, components to modulate the laser source to generate a laser pulse having a predetermined gain-switched pulse shape, and optical components for focusing the laser beam onto the target region. The predetermined pulse shape includes an optical rise time of the laser pulse fast enough to efficiently couple laser energy to a target structure, with a pulse duration of sufficient length to efficiently heat and vaporize the target material, and a pulse decay time which is rapid enough to avoid damage of structures surrounding the target material In a construction of a system using the invention it can also be advantageous to operate the laser at pulse repetition rates exceeding the material processing rate and utilize a computer controlled optical switch to select processing pulses, the computer being operatively connected to a beam positioning system used to position a focused laser beam for material processing.

The specific embodiment of the MOPA configuration for fast pulse generation for cleanly blowing metal links is taken as an example of pulse shaping and is provided to be illustrative rather than restrictive. Through direct modulation of the seed laser, excellent sub-nanosecond control over the pulse shape was maintained, and found to be advantageous, including the possibility of fast compensation to correct the output pulse shape. Other applications in micromachining, marking, scribing, etc. could also benefit from precise, fast pulse control. For example, the seed diode could as easily be modulated with a "sawtooth" waveform or other non Q-switched waveshape for the purpose of creating or removing a specific feature on or within a surface. Likewise, because of the fast response of the laser diode, it is possible to generate a sequence of variable width, short pulses in rapid succession. Those skilled in the art of laser processing will recognize the broad application of the laser system herein.

Smart disclosed alternative methods for pulse generation and shaping. For example, to obtain relatively flat pulses by using various control functions to drive a pockels cell or optical switches provided that the modulator response time is fast enough.

Q-switched laser systems can be modified to provide short pulses of various shapes. Typical prior art lasers that produce high peak power, short pulse lasers are standard Q-switched lasers. These lasers produce a temporal pulse having a moderate pulse rise time. It is possible to change this temporal shape by using a Pockels Cell pulse slicer that switch out sections of the laser beam. In U.S. Pat. No. 4,483,005 (i.e., the '005 patent), various methods for affecting (i.e., reducing) laser beam pulse width are disclosed. As taught in the '005 patent, which is hereby incorporated by reference, the laser pulse can be shaped somewhat to produce a "non-Gaussian" shaped beam by truncating energy outside the central lobe. It should be noted that if a relatively broad Q-switched waveform is to be transformed to a narrow, uniform shape, only a small fraction of the pulse energy will be used. For example, truncation of a Gaussian pulse to provide a sharp rise time and a narrow pulse with flatness to within 10% reduces the pulse energy by about 65%.

Similarly, in U.S. Pat. No. 4,114,018 (the '018 patent), temporal pulse shaping to produce square pulses is disclosed. FIG. 7 shows the time interval for relatively flat laser power output. In the '018 patented method, it is necessary to remove a temporal segment of the beam intensity in order to generate the desired pulses There are numerous advantages cited above of the preferred system of the seed laser and fiber amplifier. Current modulation of the laser diode with an appropriate driver can directly produce a desired gain-switched pulse shape which is amplified by the fiber laser amplifier with low distortion. The method is contemplated as the best and most efficient approach to practicing the present invention. However, those skilled in the art of laser pulse generation and shaping will recognize that other less efficient approaches can be used. For example, modifications of Q-switched systems extending beyond the teachings of U.S. Pat. No. 4,483,005 are possible to obtain relatively flat pulses by using various control functions to drive a pockels cell or optical switches provided that the modulator response time is fast enough.

The Cordingley publication (in which Smart is incorporated by reference) further discloses pulse shaping and generation of sequences of pulses.

Gu generally discloses link processing with pulse widths below 1 ns, and most preferably in the range of about 10 ps to 50 ps. In at least one embodiment a seed laser output is amplified with a fiber optic amplifier to remove a link with one or more pulses. In at least one embodiment Gu discloses a GHZ modulator or compressor to compress or slice a pulse. The slicing/compressing may be carried out prior to a step of amplifying.

Gu discloses, by way of example, q-switched microlasers may be used to provide pulse widths of a few nanoseconds at a repetition rates of about 10 KHz-100 KHz. Further processing of the nanosecond pulses may occur (as will be shown, for example, the embodiment shown in FIG. 8b of Gu) wherein a high speed modulator is used to "slice" or compress the pulse to the picosecond scale, followed by amplification.

A sequence of laser pulses may include at least one pulse having a pulse width greater than about 1 nanosecond, and the method may further comprise compressing or slicing the at least one nanosecond pulse to produce a pulse having the duration less than about 100 ps. The seed laser is a q-switched microlaser or laser diode may have a pulse width of about one nanosecond. The compressing or slicing may be performed prior to amplifying. The seed laser may be diode pumped solid state laser. The diode pumped solid-state laser may be a fiber laser. The seed laser may be an active or passive mode locked laser. The seed laser may be a high speed semiconductor laser diode. Referring to FIGS. 8(a-c) of Gu, schematic block diagrams illustrating in further detail, constructions of exemplary laser systems various portions of which may be used in embodiments of the present invention are shown.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A system for processing an integrated circuit, the system comprising:
   a laser light source configured to output laser light pulses having an emission spectrum with full width at half maximum of less than about 1 nanometer;
   an amplifier configured to amplify said laser light pulses;
   a harmonic converter configured to convert said laser light pulses with a long source wavelength to laser light pulses with a short wavelength; and
   a beam delivery and focusing system configured to receive the amplified and converted pulses and apply one or more of the amplified and converted pulses to the integrated circuit.

2. The system as in claim 1 wherein said laser light source is configured to operate substantially continuously over a time interval.

3. The system as in claim 2 wherein the time interval is greater than 100 ns.

4. The system as in claim 2 wherein the time interval is greater than 500 ns the stored attenuation values create an arbitrary pulse shape and/or a pulse train.

5. The system as in claim 2 wherein the time interval is greater than 1 us.

6. The system as in claim 2 wherein said laser light source is configured to be turned off between link severing operations.

7. The system of claim 1, wherein said laser light source further comprises a substantially continuous laser diode source and a driver for driving the laser diode in a substantially continuous manner.

8. The system of claim 2, further comprising means for slicing the laser light output into one or more pulses.

9. The system of claim 8, wherein means for slicing the laser light output into the one or more pulses comprises means for slicing the laser light output into at least 100 slices, and wherein each pulse comprises one or more slices.

10. The system of claim 8, wherein the one or more pulses comprise a burst of multiple pulses each with a pulse width of a few picoseconds to about 30 ns and a pulse separation of 1 ns to 960 ns.

11. The system of claim 8, wherein at least one pulse comprises a non-Gaussian pulse shape.

12. The system of claim 11, the non-Gaussian pulse shape is one of the group comprising a spiked pulse shape, a ramped pulse shape, a square pulse shape, an arbitrary pulse shape and a pulse train.

13. The system of claim 8, further comprising processing control hardware and software configured to digitally store modulation information for each slice and supply amplitude control of the output laser light for each slice based on the modulation information.

14. The system of claim 1, wherein said harmonic converter comprises a frequency doubler, tripler, or quadrupler.

15. The system of claim 1, wherein said converted wavelength comprises an IR, visible, or UV wavelength.

16. The system of claim 1, wherein said converted wavelength comprises a wavelength of 400-800 nm, 650-750 nm, 500 nm, 532 nm, or 750 nm.

17. The system of claim 1, wherein said laser light source comprises a wavelength of 1 micron to about 1.55 microns.

18. The system of claim 1, wherein said laser light source comprises tunable source for generating a plurality of laser pulses, each characterized by a narrow emission spectrum having a full width at half maximum intensity of less than about 1 nanometer and a different center wavelength.

19. The system of claim 18, further comprising a pulse selector for selecting one or more pulses having a desired center wavelength.

20. The system of claim 19, wherein said pulse selector comprises a gate or modulator to block or attenuate unselected pulses.

21. The system of claim 1, wherein said one or more pulses are characterized by an emission spectrum with a full width at half maximum intensity of less than about 0.25 nanometers.

22. The system of claim 1, wherein said one or more pulses are characterized by an emission spectrum with a full width at half maximum intensity of less than about 0.1 nanometers.

23. The system of claim 1, further comprising a modulator means for controllably modifying a characteristic of the laser beam to produce one or more pulses without substantially broadening of the emission spectrum.

24. The system of claim 1, wherein the light source is directly modulated at GHz rates.

25. The system of claim 1, wherein the light source is a seed laser source.

26. The system of claim 25, wherein the seed laser source includes a wavelength selective element.

27. The system of claim 25, wherein the seed laser source includes a dynamically tunable wavelength selective element.

28. The system of claim 1, wherein the amplifier is a fiber laser amplifier configured to amplify pulses.

29. The system as in claim 2 wherein said laser light source-is configured to operate substantially continuously with a seed pulse repetition rate of at least 10 kHz.

30. The system as in claim 1, wherein the integrated circuit comprises conductive structures and the beam delivery and focusing system is configured to apply pulses at focused laser spots positioned relative to conductive structures to sever conductive links of a memory device.

31. The system as in claim 1, further comprising a spectrally selective element for selecting the emission spectrum.

32. The system as in claim 1, wherein the amplifier comprises at least 20 decibels of gain.

33. The system as in claim 1, wherein the pulses are fast rise and fast fall pulses.

34. A system for processing an integrated circuit, the system comprising:
    a laser light source configured to output laser light having a full width at half maximum intensity of less than about 1 nanometer during a substantial fraction of a seed pulse duration;
    an amplifier configured to amplify said laser light;
    a harmonic converter configured to convert said laser light with a long source wavelength to laser light with a short wavelength; and
    a beam delivery and focusing system configured to receive the amplified and converted laser light and apply the amplified and converted laser light to the integrated circuit.

35. The system of claim 34, comprising a spectra narrowing element to narrow the bandwidth of the laser light.

36. A green fiber laser system for severing conductive links on an integrated circuit comprising:
    an infrared seed laser and a spectrally selective element for producing an infrared laser light emission spectrum of 1 nm or less;
    means for controllably modifying a temporal characteristic of the emission to produce one or more shaped pulses without substantial broadening of the emission spectrum;
    an amplifier configured to amplify said infrared emission;
    a harmonic converter configured to convert the wavelength of the laser light emission spectrum from infrared to green wavelengths; and
    a beam delivery and focusing system configured to receive the amplified and converted pulses and apply one or more of the amplified and converted pulses to the integrated circuit.

37. The laser system of claim 36, wherein the means for controllably modifying comprises a pulse shape modulator.

* * * * *